(12) United States Patent
Min et al.

(10) Patent No.: US 9,455,329 B2
(45) Date of Patent: Sep. 27, 2016

(54) JUNCTIONLESS SEMICONDUCTOR DEVICE HAVING BURIED GATE, APPARATUS INCLUDING THE SAME, AND METHOD FOR MANUFACTURING THE SEMICONDUCTOR DEVICE

(71) Applicant: SK hynix Inc., Icheon (KR)

(72) Inventors: Kyung Kyu Min, Seoul (KR); Min Soo Yoo, Yongin (KR); Il Woong Kwon, Daejeon (KR)

(73) Assignee: SK HYNIX INC., Icheon (KR)

( * ) Notice: Subject to any disclaimer, the term of this patent is extended or adjusted under 35 U.S.C. 154(b) by 78 days.

(21) Appl. No.: 14/553,811

(22) Filed: Nov. 25, 2014

(65) Prior Publication Data

US 2015/0079737 A1   Mar. 19, 2015

Related U.S. Application Data

(62) Division of application No. 13/722,504, filed on Dec. 20, 2012, now Pat. No. 8,923,035.

(30) Foreign Application Priority Data

Aug. 31, 2012  (KR) .................. 10-2012-0096602

(51) Int. Cl.
| | |
|---|---|
| H01L 27/10 | (2006.01) |
| H01L 29/66 | (2006.01) |
| H01L 27/12 | (2006.01) |
| H01L 21/84 | (2006.01) |
| G11C 7/06 | (2006.01) |
| G11C 8/10 | (2006.01) |
| H01L 21/265 | (2006.01) |
| H01L 29/36 | (2006.01) |
| H01L 29/78 | (2006.01) |

(52) U.S. Cl.
CPC .......... *H01L 29/66484* (2013.01); *G11C 7/06* (2013.01); *G11C 8/10* (2013.01); *H01L 21/265* (2013.01); *H01L 21/845* (2013.01); *H01L 27/1211* (2013.01); *H01L 29/36* (2013.01); *H01L 2029/7857* (2013.01)

(58) Field of Classification Search
USPC ....................................................... 365/149
See application file for complete search history.

(56) References Cited

U.S. PATENT DOCUMENTS

| | | | |
|---|---|---|---|
| 7,927,962 B2 | 4/2011 | Yoo | |
| 2001/0048130 A1* | 12/2001 | Hayashi | H01L 27/115 257/315 |
| 2006/0011968 A1* | 1/2006 | Kwon | H01L 21/28123 257/315 |
| 2010/0276662 A1 | 11/2010 | Colinge | |
| 2011/0037111 A1* | 2/2011 | Kim | H01L 27/10885 257/302 |
| 2011/0280076 A1 | 11/2011 | Samachisa et al. | |
| 2012/0074518 A1* | 3/2012 | Kim | H01L 29/4236 257/506 |
| 2012/0080759 A1* | 4/2012 | Ema | H01L 21/823807 257/402 |
| 2013/0043519 A1* | 2/2013 | Moon | H01L 29/4236 257/296 |

\* cited by examiner

*Primary Examiner* — Min Huang

(57) ABSTRACT

A junctionless semiconductor device having a buried gate, a module and system each having the same, and a method for forming the semiconductor device are disclosed. A source, a drain, and a body of a semiconductor device having a buried gate are doped with the same type of impurities, so that the junctionless semiconductor device does not include a PN junction between the source and the body or between the body and the drain. As a result, a leakage current caused by GIDL is reduced so that operation characteristics of the semiconductor device are improved and the size of a current-flowing region is increased, resulting in an increased operation current.

8 Claims, 11 Drawing Sheets

JUNCTIONLESS SEMICONDUCTOR DEVICE HAVING BURIED GATE, APPARATUS INCLUDING THE SAME, AND METHOD FOR MANUFACTURING THE SEMICONDUCTOR DEVICE

CROSS-REFERENCE TO RELATED APPLICATION

The present application is a divisional of U.S. patent application Ser. No. 13/722,504, filed Dec. 20, 2012, which claims priority to Korean Patent Application No. 10-2012-0096602, filed 31 Aug. 2012, which are disclosed by reference in their entirety.

BACKGROUND OF THE INVENTION

Embodiments of the present invention relate to a semiconductor device including a buried gate, and more particularly to a semiconductor device having a buried gate, which does not include a PN junction between a source and a body or between a body and a drain.

Generally, a semiconductor is a material that falls in category between a conductor and a nonconductor among materials affected by electrical conductivity. Although a pure semiconductor is similar to a nonconductor, electrical conductivity of the semiconductor increases by impurity implantation or other manipulation. The semiconductor is used to form semiconductor devices through the impurity implantation and/or conductor connection. A representative example of the semiconductor devices is a semiconductor memory device.

A semiconductor memory device includes a plurality of transistors. A transistor has three regions, i.e., a gate, a source, and a drain. Electric charges move between the source and the drain according to a control signal (the magnitude of voltage) input to the gate of the transistor. The charges moves between the source and the drain through a channel region formed under the gate in accordance with properties and operations of the semiconductor device.

Generally, a method for manufacturing a transistor includes forming a gate over a semiconductor substrate and forming a source and a drain by doping impurities into portions of the semiconductor substrate located at both sides of the gate. In this case, a region between the source and the drain and below the gate is used as a channel region of the transistor. If a transistor including a horizontal channel region is used, it is difficult to reduce the overall area of a semiconductor device including a plurality of transistors since the plurality of transistors, each including a horizontal channel region, occupies a substantial area.

In order to solve the above-mentioned problem, a three-dimensional (3D) transistor including a vertical gate, such as a recess gate, a fin gate, or a buried gate, in which all or some parts of the gate are buried by etching a semiconductor substrate, has been proposed.

However, even if a semiconductor device includes 3D transistors, a memory cell still uses an NMOS transistor in which P-type impurities are implanted into a channel region formed below a gate oxide film and high-density N-type impurities are implanted into a source/drain region. Accordingly, multi-stage ion implantation processes are needed for manufacturing the NMOS transistor.

In addition, if a gate is buried in a semiconductor substrate in the same manner as in a buried gate, an overlapping region is generated between the gate and a source/drain region. However, if the gate overlaps with the source/drain region, Gate Induced Drain Leakage (GIDL) characteristics change according to the size of the overlapping region. As a result, retention characteristics capable of maintaining data stored in a capacitor also change. That is, buried gates may be formed to have different heights when a buried-gate material is etched back in a buried gate structure. In this case, overlapping regions of respective cell transistors are irregularly formed so that a large difference may occur in retention characteristics of respective cells, resulting in the occurrence of a serious problem in a semiconductor device composed of gigabit cells.

BRIEF SUMMARY OF THE INVENTION

Various embodiments of the present invention are directed to providing a semiconductor device including a buried gate, a module and a system each including the same, and a method for manufacturing the semiconductor device, which substantially obviate one or more problems due to limitations and disadvantages of the related art.

An embodiment of the present invention relates to a semiconductor device that does not have a PN junction between a junction region and a substrate (hereinafter, a "junctionless semiconductor device") by implanting the same type of impurities into a source, a drain and a body (substrate) in the semiconductor device having a buried gate structure so that a current selectively flows between the source and the drain according to a new method.

In accordance with an aspect of the present invention, a junctionless semiconductor device includes: an active region defined by a device isolation film; an insulation layer formed below the active region; and a gate formed over the insulation layer, and buried in the device isolation film and the active region, wherein both sides and a lower part of the gate in the active region are doped with the same-type impurities.

The impurities may be implanted into the active region with substantially uniform density.

The active region may be formed of a silicon layer, and the impurities may be N-type impurities. The active region may be formed is any of a silicon germanium (SiGe) substrate, a germanium (Ge) substrate, and a 3- or 5-group compound semiconductor substrate, and the impurities may be P-type impurities.

The active region may be floated by the insulation layer.

The insulation film may be a buried insulation film in which an insulation film is buried. The buried insulation film may include an oxide film. The insulation film may be a depletion layer caused by a back-bias voltage applied to a lower part of a substrate.

A region in which the gate is formed may have a fin structure in which a bottom surface of the active region is more protruded than a bottom surface of the device isolation film.

In accordance with another aspect of the present invention, a junctionless semiconductor device includes: a lower silicon layer; an insulation layer formed over the lower silicon layer; an active region formed over the insulation layer, and buried in the device isolation film and the active region; and a gate formed over the insulation film, and buried in the device isolation film and the active region, wherein both sides and a lower part of the gate in the active region are doped with the same-type impurities.

In accordance with another aspect of the present invention, a method for forming a junctionless semiconductor device includes: forming a device-isolation trench that defines an active region by etching an upper silicon layer and a buried insulation film from a substrate in which a lower silicon layer, the buried insulation film and the upper silicon layer are laminated; forming a device isolation film by filling the device isolation trench with an insulation film; implanting the same-type impurities into the entirety of the active region; and forming a gate buried in the active region and the device isolation film.

In accordance with another aspect of the present invention, a method for forming a junctionless semiconductor device includes: forming an insulation layer in a semiconductor substrate; forming a device-isolation trench defining an active region by etching the insulation layer and the semiconductor substrate formed over the insulation layer; forming a device isolation film by filling the device isolation trench with an insulation film; implanting the same-type impurities into the entirety of the active region; and forming a gate buried in the active region and the device isolation film.

The implanting the impurities may include: implanting the same-type impurities into a source, a drain, and a body of a transistor formed in the active region.

The implanting the impurities may include: implanting the impurities into the active region in a manner that the active region has a substantially uniform density.

The implanting the impurities may include: implanting the impurities into the active region before forming the device isolation film. The implanting the impurities may include: implanting the impurities into the active region after forming the device isolation film.

The implanting the impurities may include: forming a gate recess in which the gate is to be buried by etching the active region and the device isolation film; and implanting impurities into the active region through the gate recess. The forming the gate recess may include: forming a fin structure in which a bottom surface of the active region is more protruded than a bottom surface of the device isolation film.

The implanting the impurities may include: implanting the impurities using at least one of a multi-stage ion implanting process, a tilt ion implanting process, and an orient ion implanting process.

In accordance with another aspect of the present invention, a junctionless semiconductor device includes: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

The junctionless semiconductor device may further include: a back-bias provider configured to apply a back-bias voltage to a back surface of a substrate including the cell array.

In accordance with another aspect of the present invention, a semiconductor module including a plurality of semiconductor devices mounted to a substrate includes: each of the semiconductor devices including: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

In accordance with another aspect of the present invention, a semiconductor system which includes a semiconductor module including a plurality of semiconductor devices mounted to a substrate, and a controller for controlling operations of the semiconductor module includes: each of the semiconductor devices including: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

In accordance with another aspect of the present invention, a computer system which includes not only a semiconductor system having at least one semiconductor module but also a processor for processing data stored in the semiconductor system includes: the semiconductor module including a plurality of semiconductor devices mounted to a substrate, wherein the semiconductor device includes: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

In accordance with another aspect of the present invention, a data processing system including at least one semiconductor device mounted to a substrate includes: each of the semiconductor devices including: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

In accordance with another aspect of the present invention, an electronic system including at least one data processing system includes: the data processing system including at least one semiconductor device mounted to a substrate, wherein the semiconductor device includes: a cell array including a plurality of cells coupled to a bit line and a buried gate; a sense amplifier coupled to the bit line so as to sense data stored in the cell; a row decoder coupled to the buried gate so as to generate a signal for turning on or off the cell; and a column decoder for generating a drive signal used to operate the sense amplifier coupled to the cell selected by the row decoder, wherein the same-type impurities are implanted into a source, a drain, and a body of the cell.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
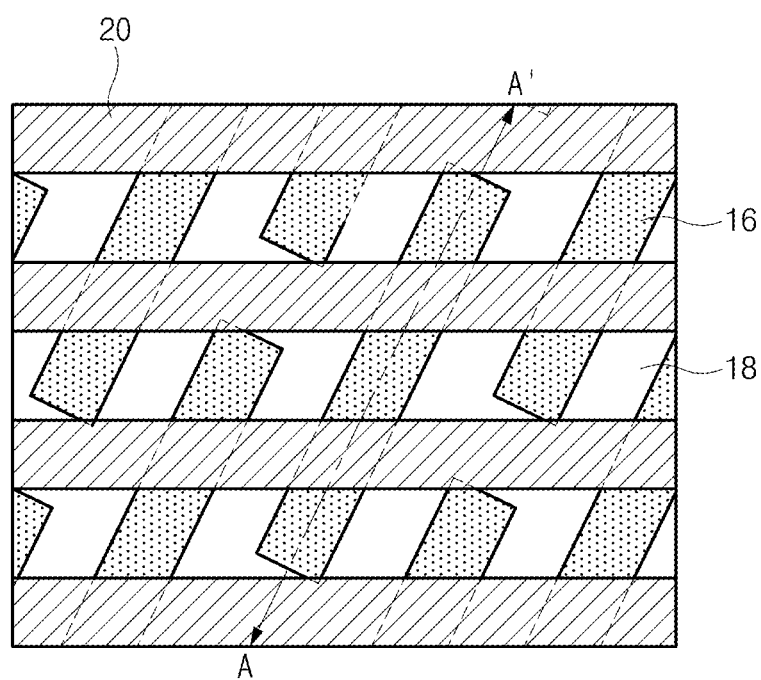
FIG. 1 illustrates a plane view of a semiconductor device including a $6F^2$ structure according to an embodiment of the present invention.
Figure 2:
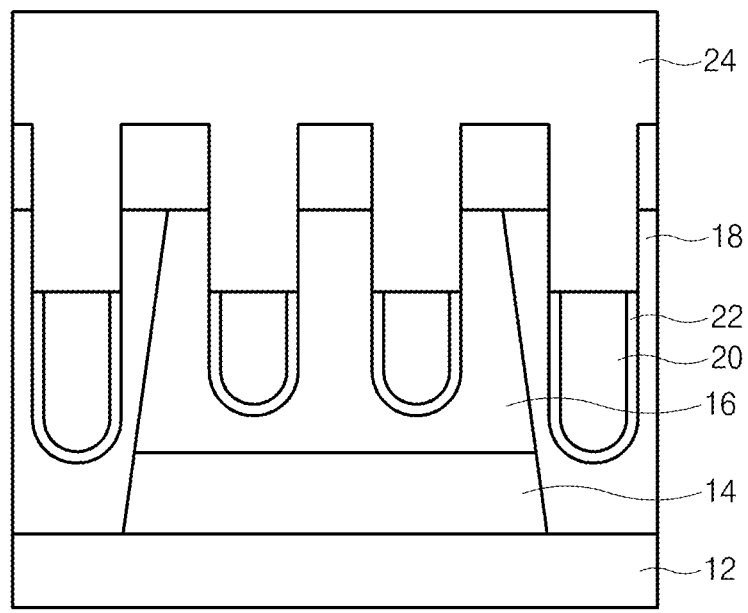
FIG. 2 illustrates a cross-sectional view of the semiconductor device taken along a line A-A' of FIG. 1.

FIG. 1 illustrates a plane view of a semiconductor device including a $6F^2$ structure. FIG. 2 illustrates a cross-sectional view of the semiconductor device taken along a line A-A' of FIG. 1.

Referring to FIGS. 1 and 2, a buried insulation film 14 and an active region 16 are formed as an island type defined by a device isolation film 18 formed over a lower silicon layer 12. The buried insulation film 14 and the active region 16 form a laminate structure over the lower silicon layer 12. That is, the active region 16 is electrically isolated from the lower silicon layer 12 by the buried insulation film 14. In an embodiment, the buried insulation film 14 and the active region 16 may be formed by etching a buried insulation film and an upper silicon layer of, e.g., a Silicon On Insulator (SOI) substrate. In another embodiment, an insulation film is buried in a bulk silicon substrate so that a buried insulation film 14 may be formed. A representative example of a method for burying an insulation film in the bulk silicon substrate has been disclosed in U.S. Pat. No. 7,927,962. The buried insulation film 14 may include an oxide film.

In FIG. 2, the buried insulation film 14 is patterned to form an island type to electrically isolate the active region 16 from the lower silicon layer 12. In another embodiment, the buried insulation film 14 may not be etched. That is, in an embodiment, only the upper silicon layer may be etched to form the island type active region 16.

The gate 20 is buried in the active region 16 and the device isolation film 18 at a predetermined depth, and the active region 16 is formed to obliquely cross the buried gate 20.

A region including the buried gate 20 is formed to have a fin structure in which a depth of the buried gate 20 formed in the device isolation film 18 is greater than a depth of the buried gate 20 formed in the active region 16.

Specifically, the active region 16 is formed of a one-type impurity region in which the same type impurities, e.g., N-type impurities, are implanted with the substantially uniform density. In an embodiment, the active region 16 may have a uniform doping profile. That is, a cell transistor having a conventional buried gate includes a PN junction structure in which P-type impurities are implanted in a body including a channel region and N-type impurities are implanted in a junction region, e.g., a source region or a drain region, coupled to each of a capacitor and a bit line. In accordance with an embodiment of the present invention, the same-type impurities are implanted into the body and the source and drain regions so that a PN junction structure is not formed.

Typically, an NMOS transistor is formed over a silicon substrate of a cell region of a DRAM device. Impurities implanted into the active region 16 may be N-type impurities. N-type impurities may be group 5 impurities such as arsenic (As), phosphorus (P), bismuth (Bi), or antimony (Sb). Here, the group 5 impurities may be used independently or in combination.

However, if a substrate in which the active region 16 is formed is any of a silicon germanium (SiGe) substrate, a germanium (Ge) substrate, and a group 3 or a group 5 compound semiconductor substrate, P-type impurities may be implanted into the active region 16. P-type impurities may be group 3 impurities such as aluminum (Al), boron (B), indium (In), or gallium (Ga). The group 3 impurities may be used independently or in combination.

In the active region 16, a gate insulation film 22 is formed between the buried gate 20 and the active region 16, and a capping insulation film 24 is formed over the buried gate 20. In an embodiment, the gate insulation film 22 may be formed of either a silicon oxide film ($SiO_2$) or a high-K material having a higher dielectric constant (higher permittivity) than the $SiO_2$ film. The capping insulation film 24 may be formed of a nitride film.

The active region 16 of the junctionless semiconductor device according to an embodiment is doped with the same type of impurities. As a result, when a read/write operation is not being performed, a region between the buried gate 20 and the buried insulation film 14 of the semiconductor device shown in FIG. 2 has a depletion status.

FIGS. 3 to 7 are cross-sectional views illustrating a method for forming the semiconductor device of FIG. 2.

Figure 3:
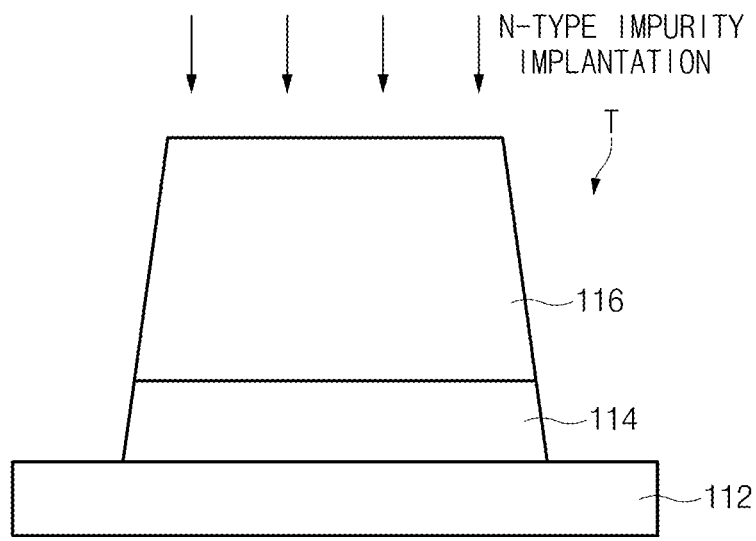
FIGS. 3 to 7 are cross-sectional views illustrating a method for forming the semiconductor device of FIG. 2.

Referring to FIG. 3, a pad oxide film (not shown) and a pad insulation film (not shown) are formed over a Spin On Insulator (SOI) substrate on which a lower silicon layer 112, a buried insulation film (not shown) and an upper silicon layer (not shown) are deposited. Subsequently, after a photoresist film (not shown) is formed over the pad nitride film, a photoresist pattern (not shown) defining an active region is formed over the pad nitride film through a photolithographic process using a Shallow Trench Isolation (STI) method. The pad nitride film and the pad oxide film are sequentially etched using the photoresist pattern as an etch mask, resulting in formation of a mask pattern (not shown). Thereafter, a device-isolation trench T defining a buried insulation film 114 and an active region 116 is formed by etching the upper silicon layer and the buried insulation film. The etching process may be a dry etching process.

Subsequently, a sidewall insulation film (not shown) is formed over the resultant structure including the device-isolation trench T. The sidewall insulation film may include a wall oxide film, and may be formed by an oxide process.

In an embodiment, the sidewall insulation film is formed as thin as possible such that the device-isolation trench T secures a predetermined space and the width of the active region 116 can be increased so that it is as large as possible. That is, assuming that the device-isolation trench T has a very small space or width, if the size of the space is insufficient when an insulation film is buried in the device-isolation trench T to form a device isolation film 118 in a subsequent process, a void may be formed in the device isolation film 118. In this case, a bridge may be generated between gates. Therefore, the sidewall insulation film should be formed as thin as possible. The width of the device-isolation trench T can be maintained in the same manner as in the related art, and, as a result, the width of the active region 116 can be increased.

Subsequently, N-type impurities are implanted into the active region 116 in which P-type impurities have been implanted by P-well formation, so that the entire active region 116 is converted into an N-type impurity region. The N-type impurities may be implanted so that the entire active region 116 has a uniform doping profile. That is, the entire active region 116 is doped so that a uniform density is reached.

The N-type impurities may be any of arsenic (As), phosphorus (P), bismuth (Bi), antimony (Sb), and a combination thereof.

The aforementioned impurity implantation process may be carried out by performing a multi-stage ion implanting process (also called a multi-ion implanting process), a tilted ion implanting process, or an orient ion implanting in which a substrate is rotated in up, down, left and right directions.

In addition, the impurity implantation process can optimize ionization energy to uniformly implant the same-polarity impurities into a lower part to an upper part of the active region 116 with substantially the same density.

In addition, an annealing (e.g., rapid thermal annealing (RTA)) process may also be carried out at a temperature of 900° C.~1100° C. in such a manner that the implanted impurities can uniformly disperse in the active region 116.

Figure 4:
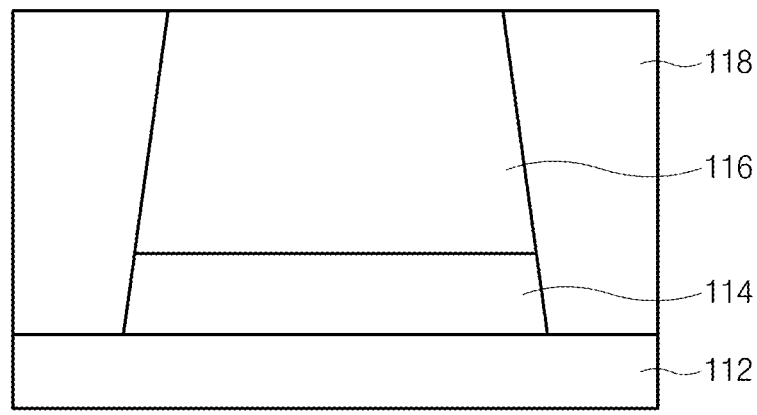

Referring to FIG. 4, after an insulation film is formed to fill the device-isolation trench T, the insulation film is planarized (CMP-processed) to expose the active region 116, so that the device isolation film 118 defining the active region 116 is formed.

The device isolation film 118 may include at least one of a Boro-phospho Silicate Glass (BPSG) film, a Phosphorous Silicate Glass (PSG) film, a Spin On Glass (SOG) film, a Polysilazane (PSZ) film, an O3-TEOS (Tetrahydroxysilane) film, a High Density Plasma (HDP) oxide film, and an Atomic Layer Deposition (ALD) film.

Figure 5:
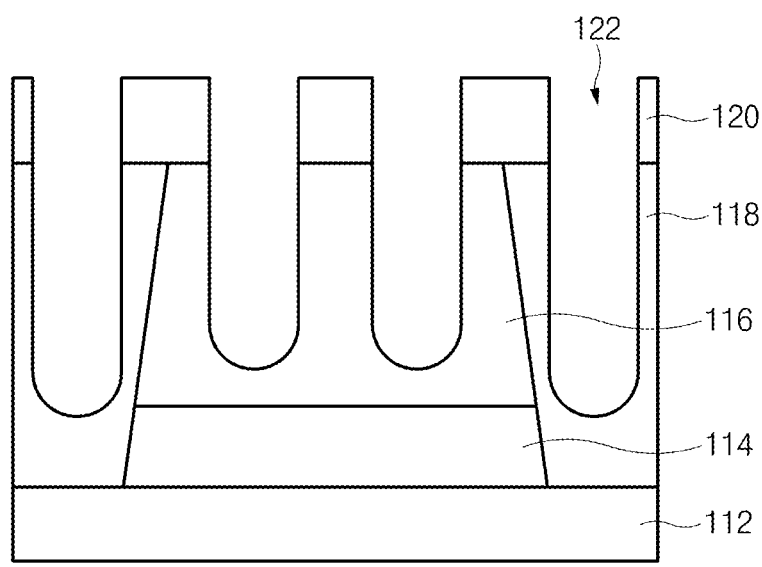

Subsequently, referring to FIG. 5, after a hard mask layer (not shown) is formed over the active region 116 and the device isolation film 118, a photoresist pattern (not shown) defining a gate region is formed over the hard mask layer. A hard mask pattern 120 is formed by etching the hard mask layer using the photoresist pattern as an etch mask.

The active region 116 and the device isolation film 118 are etched to a predetermined depth using the hard mask pattern 120 as an etch mask, such that a gate recess 122 defining the gate region is formed.

In an embodiment, the device isolation film 118 is etched more deeply than the active region 116 using an etch selection ratio of the active region 116 and the device isolation film 118. As a result, a fin structure is formed in which a gate recess formed in the device isolation film 118 has a greater depth than a gate recess formed in the active region 116.

Figure 6:
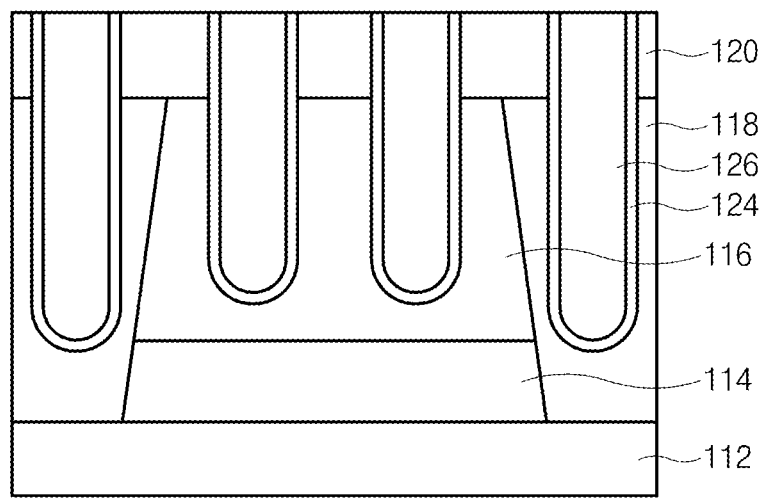

Referring to FIG. 6, a gate insulation film 124 is formed along an inner surface of the gate recess 122.

The gate insulation film 124 may be formed of a silicon oxide ($SiO_2$) film or a high dielectric (high-K) material having a higher dielectric constant (higher permittivity) than the silicon oxide ($SiO_2$) film. The gate insulation film 124 may be formed using a radio oxidation process or a Chemical Vapor Deposition (CVD) process.

A conductive film 126 is formed over the gate insulation film 124 to fill the gate recess 122. The gate conductive film 126 may include a metal material such as tungsten (W).

Figure 7:
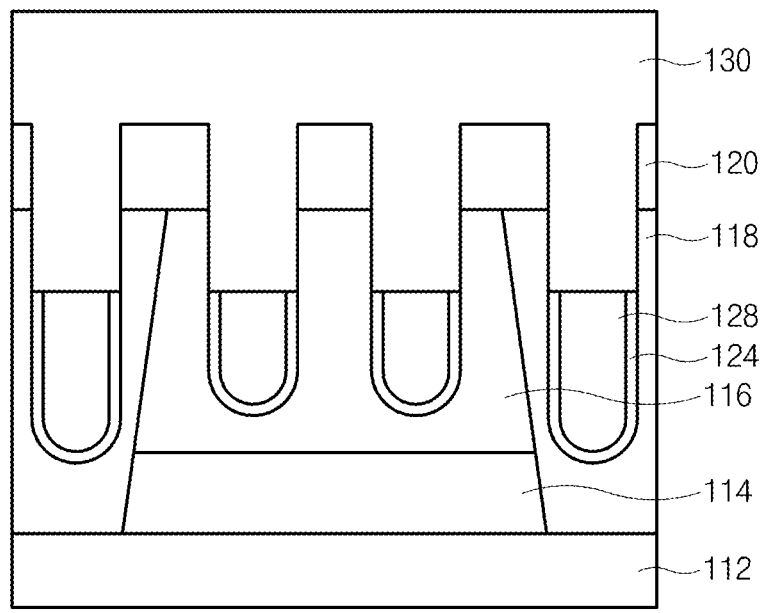

Referring to FIG. 7, the conductive film 126 is etched back until the gate conductive film 126 remains only at a lower part of the gate recess 122, resulting in formation of a buried gate 128. At this time, the gate insulation film 124 exposed when the conductive film 126 is etched back is also etched.

Subsequently, a capping insulation film 130 is formed over a resultant structure including the buried gate 128. The capping insulation film 130 is then planarized using, e.g., a chemical mechanical polishing (CMP) process.

A method for forming a bit line and a capacitor (not shown) in a subsequent process is identical to a method for forming a bit line and a capacitor in a $6F^2$ structure having a conventional buried gate, and thus a detailed description thereof will be omitted for convenience of description.

In accordance with the above-described embodiment, impurities are implanted into the active region 116 before formation of the device isolation film 118 after the device-isolation trench T is formed. However, the impurities may be implanted into the active region 116 after the device isolation film 118 is formed as shown in FIG. 4, or the impurities may be implanted into the active region 116 through the gate recess 122 after the fin-type gate recess 122 is formed as shown in FIG. 5.

Figure 8:
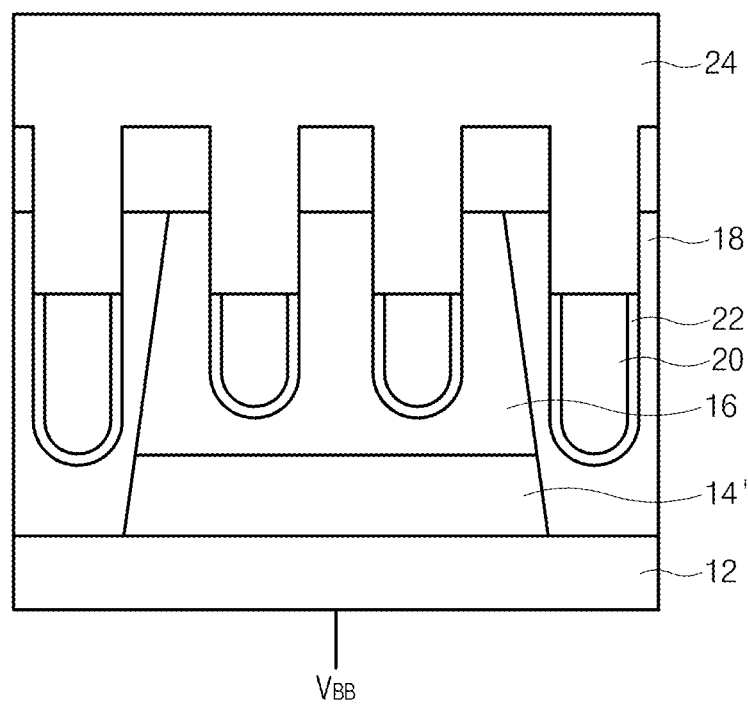
FIG. 8 illustrates a cross-sectional view of a semiconductor device according to another embodiment of the present invention.

FIG. 8 illustrates a cross-sectional view of a semiconductor device according to another embodiment of the present invention.

While, in FIG. 2, the active region 16 is isolated from the lower silicon layer 12 by the buried insulation film 14 buried in the substrate, a bulk substrate is used in a structure shown in FIG. 8. That is, in accordance with the embodiment shown in FIG. 8, an active region 16 is formed by etching the bulk substrate, and a back bias voltage VBB is applied to a back side of the bulk substrate. According to this embodiment, a level of the back bias voltage VBB applied to the back side of the substrate is adjusted to float the active region 16, so that a depletion layer 14' is formed at a lower part of the active region 16.

In other words, if N-type impurities are implanted into the active region 16 of a silicon substrate, a PN junction is formed between the N-type impurity implanted active region 16 and the P-type impurity implanted bulk substrate 12, so that a current that flows between a source and a drain may flow in the P-type bulk substrate 12 during an operation time of the semiconductor device. Accordingly, the back-bias voltage VBB applied to the bulk region 12 becomes higher in level, so that a depletion layer 14' is formed below the active region 16 and thus a leakage current is restricted.

A method for forming the structure of FIG. 8 is substantially identical to the method illustrated in FIGS. 3 to 7, although a bulk substrate is used instead of an SOI substrate, and thus a detailed description thereof will herein be omitted for convenience of description.

Figure 9:
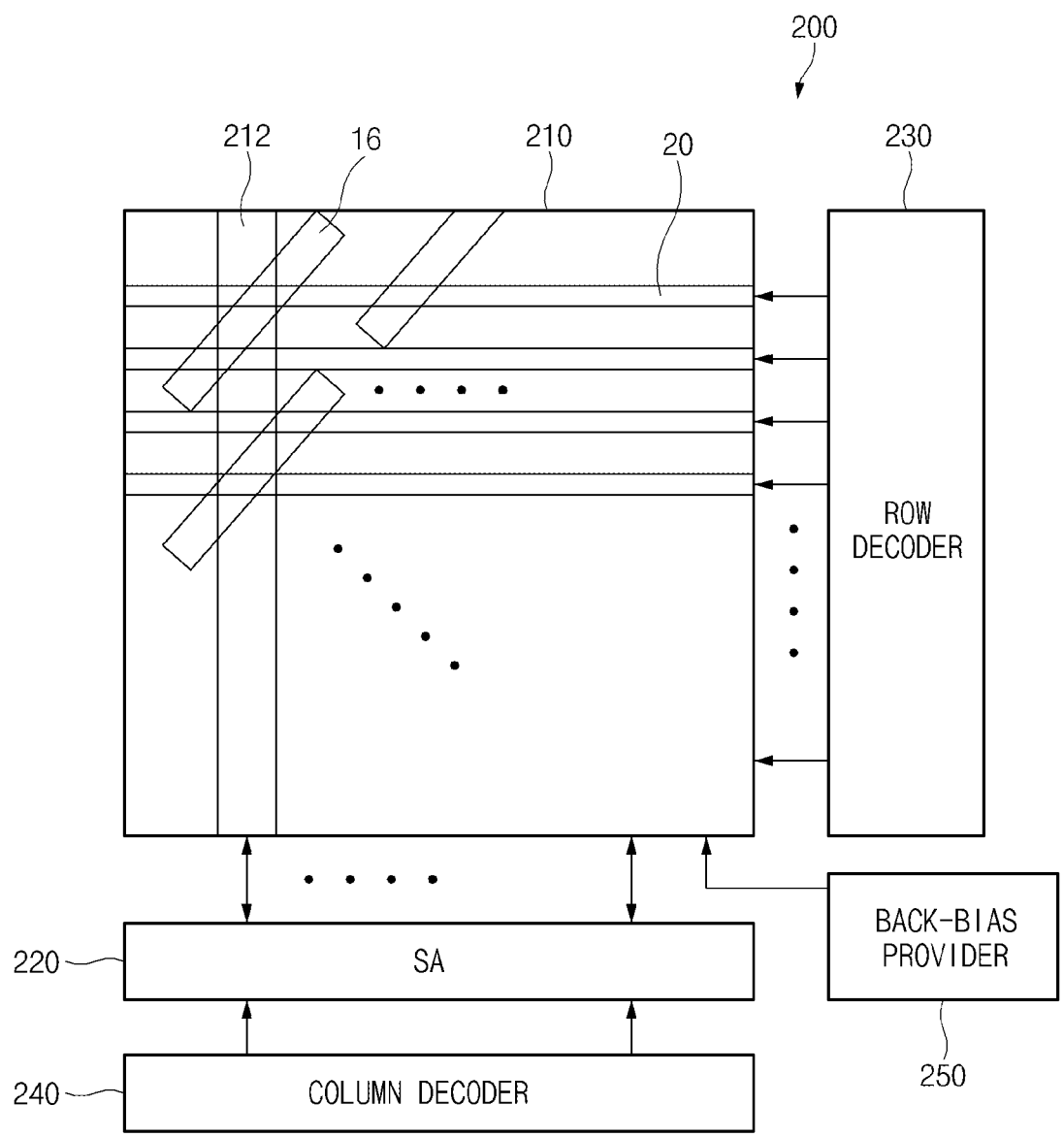
FIG. 9 illustrates a circuit diagram of a semiconductor device according to an embodiment of the present invention.

FIG. 9 illustrates a circuit diagram of a semiconductor device including a junctionless transistor. In FIG. 9, for convenience of description and better understanding of the present invention, the same reference numerals as those of FIGS. 1 and 2 represent the same elements.

Referring to FIG. 9, the semiconductor device 200 includes a cell array 210, a sense amplifier (SA) 220, a row decoder 230, a column decoder 240, and a back-bias provider 250.

The cell array 210 includes a plurality of memory cells (not shown) coupled to a word line (buried gate) 20 and the bit line 212. An active region 16 in which a transistor of a memory cell is formed, is diagonally formed in such a manner that the active region 16 obliquely crosses the word line 20 as shown in FIG. 1. In an embodiment, the same type of impurities as those of source and drain regions are implanted into a body of the active region 16 where a channel is formed until a uniform density is reached so that the active region 16 has a uniform doping profile. In addition, a buried insulation film 14 or a depletion layer 14' for floating the active region 16 is formed below the active region 16 as shown in FIG. 2 or 8.

The sense amplifier 220 is coupled to the bit line 212 so that it can sense and amplify data stored in the memory cell of the cell array 210.

The row decoder 230 is coupled to the word line (buried gate) 20, generates a signal for selectively turning on or off transistors of memory cells of the cell array 210, and outputs the signal to the word line (buried gate) 20. In this case, the row decoder 230 applies a power-supply voltage lower than a threshold voltage to non-selected word lines, and thus each channel region of transistors coupled to the non-selected word lines enters a depletion status. As a result, the non-selected word lines are deactivated. The row decoder 230 applies a power-supply voltage higher than the threshold voltage to selected word lines, and thus the depletion status formed in each channel region of transistors coupled to the selected word lines is removed. As a result, the selected word lines are activated.

The column decoder 240 generates a drive signal for operating the sense amplifier 220 coupled to a memory cell selected by the row decoder 230, and outputs the drive signal to the sense amplifier 220.

The back-bias provider 250 applies a back-bias voltage VBB to a back surface of a substrate including the cell array 210. Specifically, if the buried insulation film 14 for floating the active region 16 is not formed below the active region 16, the back-bias provider 250 generates and outputs a back-bias voltage capable of forming the depletion layer 14' at a lower part of the active region 16 as shown in FIG. 8.

The semiconductor device shown in FIG. 9 can be applied to computing memories (for example, DRAM, SRAM, DDR3 SDRAM, DDR2 SDRAM, DDR SDRAM, etc.), consumer memories (for example, DDR3 SDRAM, DDR2 SDRAM, DDR SDRAM, SDR SDRAM, etc.), graphics memories (for example, DDR3 SDRAM, GDDR3 SDMRA, GDDR4 SDRAM, GDDR5 SDRAM, etc.), mobile memories (for example, Mobile SDR, Mobile DDR, Mobile DDR2, MCP (Multi Chip Package), PoP (Package on Package), PSRAM, LPDDR), NAND flash memories, a Magnetic RAM (MRAM), a Ferroelectric RAM (FeRAM), a Phase Change RAM (PRAM), a Resistance RAM (ReRAM), a Synchronous Graphics RAM (SGRAM), and the like.

Figure 10:
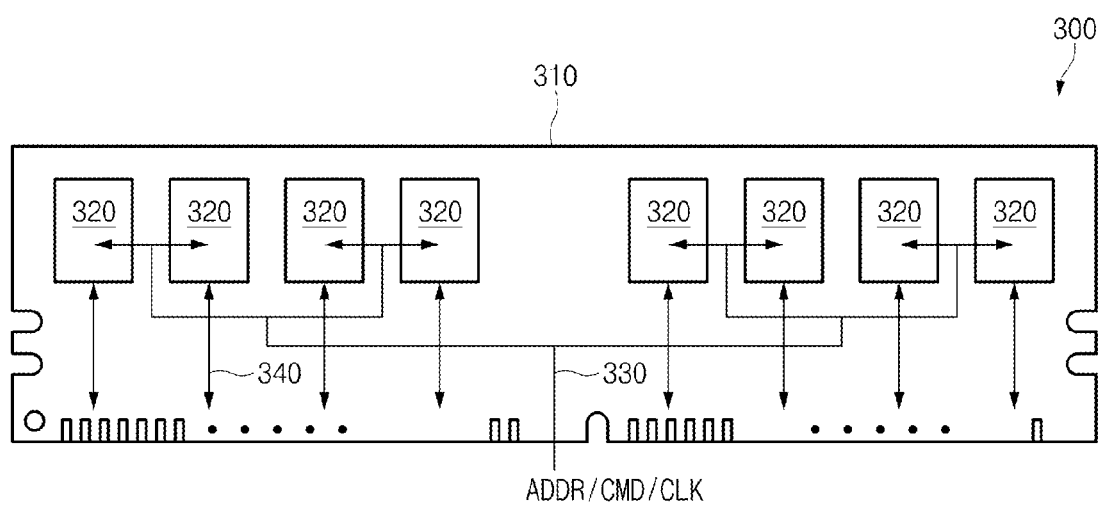
FIG. 10 illustrates a circuit diagram of a semiconductor module according to an embodiment of the present invention.

FIG. 10 illustrates a circuit diagram of a semiconductor module according to an embodiment of the present invention.

Referring to FIG. 10, the semiconductor module 300 includes a plurality of semiconductor elements 320 mounted to a module substrate 310, a command link 330 for allowing each semiconductor element 320 to receive control signals (for example, an address signal ADDR, a command signal CMD, and a clock signal CLK) from an external controller (not shown), and a data link 340 coupled to the semiconductor element 320 so as to transmit input/output (I/O) data.

In an embodiment, the semiconductor element 320 may be implemented as the semiconductor device 200 shown in FIG. 9. That is, the semiconductor device 320 has a buried gate, and an active region of the semiconductor device 320 is diagonally formed to obliquely cross the gate. The same type of impurities is implanted into a source region, a drain region, and a body region so that substantially the same density is reached in each region. The command link 330 and the data link 340 may be formed to be identical or similar to those of general semiconductor modules.

Although eight semiconductor elements 320 are mounted to a front surface of the module substrate 310 as shown in FIG. 10, it should be noted that the semiconductor elements 320 may also be mounted to a back surface of the module substrate 310. That is, the semiconductor elements 320 may be mounted to one side or both sides of the module substrate 310, and the number of mounted semiconductor elements 320 is not limited to the example shown in FIG. 10. In addition, a material and a structure of the module substrate 310 are not limited thereto.

Figure 11:
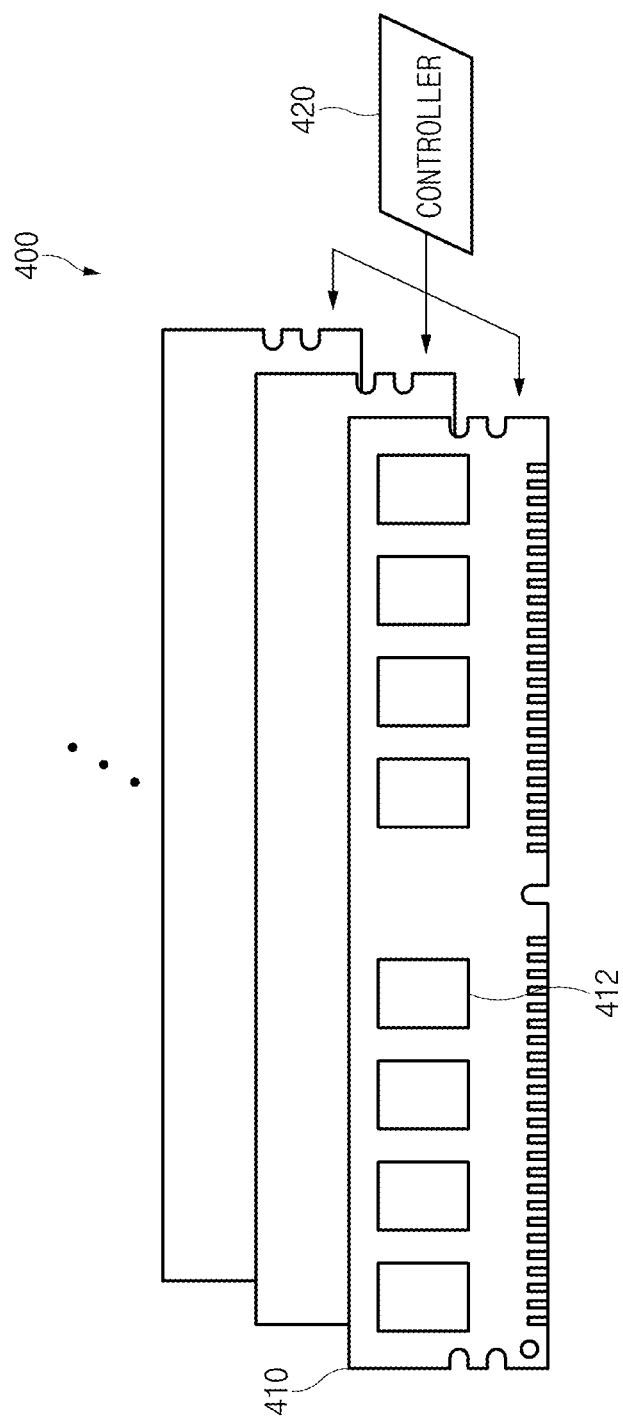
FIG. 11 illustrates a circuit diagram of a semiconductor system according to an embodiment of the present invention.

FIG. 11 shows a semiconductor system according to an embodiment of the present invention.

Referring to FIG. 11, a semiconductor system 400 includes at least one semiconductor module 410 including a plurality of semiconductor elements 412, and a controller 420 for providing a bidirectional interface between each semiconductor module 410 and an external system (not shown) so as to control operations of the semiconductor module 410.

The controller 420 may be identical or similar in function to a controller for controlling a plurality of semiconductor modules for use in a general data processing system, and thus a detailed description thereof will be omitted herein for convenience of description.

In an embodiment, the semiconductor module 410 may be the semiconductor module 300 shown in FIG. 10.

Figure 12:
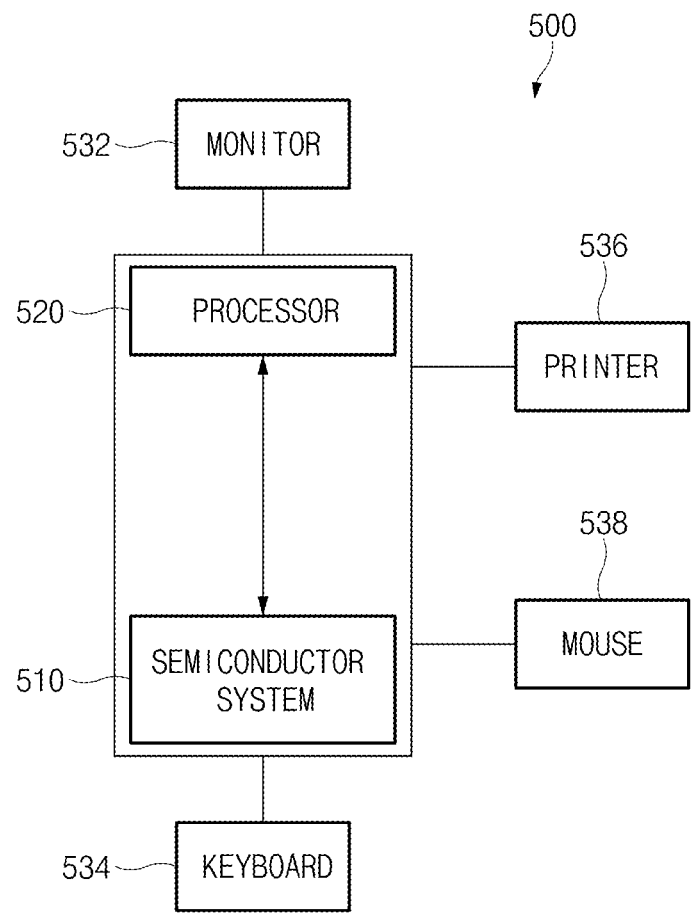
FIG. 12 illustrates a block diagram of a computer system according to an embodiment of the present invention.

FIG. 12 shows a computer system according to an embodiment of the present invention.

Referring to FIG. 12, the computer system 500 includes a semiconductor system 510 and a processor 520 such as a Central Processing Unit (CPU).

The semiconductor system 510 may store data needed for controlling operations of the computer system 500. In an embodiment, the semiconductor system 510 may include the semiconductor system 400 shown in FIG. 11. The semiconductor system 510 includes at least one semiconductor module. A semiconductor device contained in the semiconductor module has a buried gate, and an active region of the semiconductor device is diagonally formed to obliquely cross the gate. The same type of impurities is implanted into a source region, a drain region, and a body region to substantially the same density.

The processor 520 controls operations of the computer system 500 by processing data stored in the semiconductor system 510. The processor 520 may be identical or similar in function to a CPU used in a general computer system.

The computer system 500 may include a variety of user interface devices, for example, a monitor 532, a keyboard 534, a printer 536, a mouse 538, etc.

Figure 13:
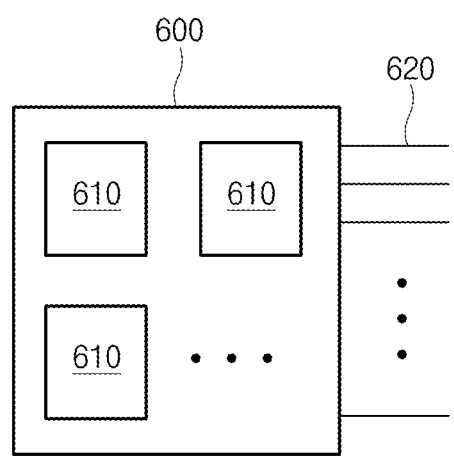
FIG. 13 illustrates a block diagram of a data processing system according to an embodiment of the present invention.

FIG. 13 shows a data processing system according to an embodiment of the present invention.

Referring to FIG. 13, the data processing system 600 is included in an electronic system (not shown), such that it performs a plurality of functions of the electronic system.

The data processing system 600 may include at least one semiconductor device 610 mounted to a substrate.

The semiconductor device 610 may include a cell array (not shown) for storing data needed for performing a specific function of the electronic system, and a processor (not shown) for performing the specific function by processing the data stored in the cell array. That is, the semiconductor device 610 includes a unit for storing data in one unit element (die or chip) and a unit for performing a specific function of the electronic system by processing the stored data. In this case, the cell array includes a plurality of memory cells coupled to a bit line and a word line (buried gate). An active region in which a transistor of a memory cell is formed is diagonally formed in such a manner that the active region is formed to obliquely cross the word line as shown in FIG. 1. In this case, the same type of impurities as those of source and drain regions are implanted into a body of the active region where a channel is formed to substantially the same density. That is, the active region has a uniform doping profile.

The data processing system 600 is coupled to other constituent elements (for example, CPUs) of the electronic system through leads 620, such that it can unidirectionally or bidirectionally transmit and receive data and control signals to and from the coupled constituent elements.

Figure 14:
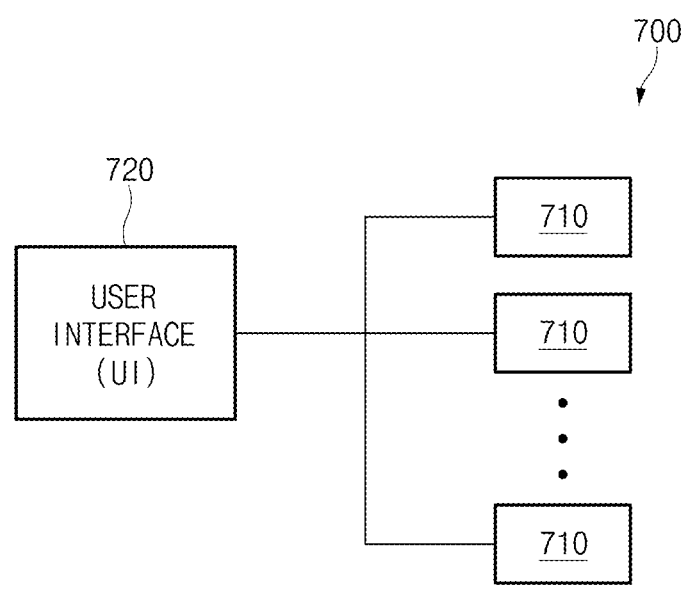
FIG. 14 illustrates a block diagram of an electronic system according to an embodiment of the present invention.

FIG. 14 shows an electronic system according to an embodiment of the present invention.

Referring to FIG. 14, the electronic system 700 includes at least one data processing system 710 and a user interface 720.

The data processing system 710 performs a specific function from among several functions of the electronic system 700, and includes at least one semiconductor device mounted to a substrate. The semiconductor device may include a cell array (not shown) for storing data needed for performing a specific function of the electronic system 700 and a processor (not shown) for controlling the specific function by processing the data stored in the cell array. In this case, the cell array includes a plurality of memory cells coupled to a bit line and a word line (buried gate). An active region in which a transistor of a memory cell is formed is diagonally formed in such a manner that the active region is formed to obliquely cross the word line as shown in FIG. 1. In this case, the same type of impurities as those of source and drain regions are implanted into a body of the active region where a channel is formed to substantially the same density. That is, the active region has a uniform doping profile.

The user interface 720 provides an interface between a user and the data processing system 710. The user interface 720 may include a keypad, a touchscreen, a speaker, etc., which is incorporated into the electronic system 700.

The electronic system 700 includes a variety of embedded systems included in various electronic, information, and communication devices, for example, computers, household appliances, factory automation systems, elevators, mobile phones, etc.

As is apparent from the above description, the same-type impurities are implanted into a source, a drain, and a body contained in a buried gate structure so that a junction is not formed in the buried gate structure. As a result, a leakage current caused by GIDL is reduced so that operation characteristics of a semiconductor device can be improved.

In addition, a semiconductor device according to an embodiment is formed to have a larger current-flowing region than a conventional MOSFET, resulting in an increased operation current.

Although the above-mentioned embodiments have exemplarily disclosed the 6F$^2$ structure in which the active region is formed to obliquely cross the word line, the scope or spirit of the present invention is not limited thereto and can also be applied to other structures. That is, the semiconductor device according to the embodiments can be applied to all structures to which a buried gate formed when the gate is buried in the active region is applied.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a junctionless semiconductor device, the method comprising:
   providing a substrate including a lower silicon layer, an insulation film, and an upper silicon layer;
   forming a device-isolation trench that defines an active region by etching the upper silicon layer and the insulation film, which are formed over the lower silicon layer;
   forming a device isolation film by filling the device isolation trench with an insulation material;
   implanting the same-type impurities into the entirety of the active region including a body and source and drain regions; and
   forming a plurality of buried gates in the active region and the device isolation film,
   wherein the implanting of the impurities includes:
   implanting the impurities into the active region so that the active region has substantially uniform density.

2. The method according to claim 1, wherein the insulation film includes a buried insulation film formed by burying an insulation material within a semiconductor substrate so that the semiconductor substrate is divided into the upper silicon layer and the lower silicon layer.

3. The method according to claim 1, wherein the implanting of the impurities includes:
   implanting the same-type impurities into a source, a drain, and a body of a transistor formed in the active region.

4. The method according to claim 1, wherein the implanting of the impurities includes:
   implanting the impurities using at least one of a multi-stage ion implanting process, a tilted ion implanting process, and a rotating ion implanting process.

5. The method according to claim 1, wherein the implanting of the impurities includes:
   implanting the impurities into the active region before forming the device isolation film.

6. The method according to claim 1, wherein the implanting of the impurities includes:

implanting the impurities into the active region after forming the device isolation film.

7. The method according to claim 1, wherein the implanting of the impurities includes:
    forming a plurality of gate recesses in which the buried gates are to be formed by etching the active region and the device isolation film; and
    implanting the impurities into the active region through the gate recesses.

8. The method according to claim 7, wherein the forming of the gate recesses includes:
    forming a fin structure in which the active region more protrudes than the device isolation film from the lower silicon layer.

* * * * *